(12) United States Patent  
Richman et al.

(10) Patent No.: US 10,186,178 B2  
(45) Date of Patent: Jan. 22, 2019

(54) TUNABLE LENTICULAR SCREEN TO CONTROL LUMINOSITY AND PIXEL-BASED CONTRAST

(71) Applicant: Sony Corporation, Tokyo (JP)

(72) Inventors: Steven Richman, San Diego, CA (US); Thomas Dawson, Escondido, CA (US); Frederick J. Zustak, Poway, CA (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/601,686

(22) Filed: May 22, 2017

(65) Prior Publication Data

US 2018/0336807 A1    Nov. 22, 2018

(51) Int. Cl.
| | |
|---|---|
| *G02F 1/13* | (2006.01) |
| *G09G 3/00* | (2006.01) |
| *G09G 5/02* | (2006.01) |
| *G09G 5/10* | (2006.01) |
| *H04N 9/31* | (2006.01) |
| *H04N 7/18* | (2006.01) |
| *G03B 21/60* | (2014.01) |
| *G02B 26/02* | (2006.01) |

(Continued)

(52) U.S. Cl.
CPC ............ *G09G 3/002* (2013.01); *G02B 26/02* (2013.01); *G02B 26/0858* (2013.01); *G02F 1/13* (2013.01); *G02F 1/15* (2013.01); *G03B 21/60* (2013.01); *G09G 5/02* (2013.01); *G09G 5/10* (2013.01); *H04N 7/183* (2013.01); *H04N 9/3141* (2013.01); *G02F 2202/30* (2013.01); *G02F 2203/30* (2013.01); *G09G 2320/066* (2013.01); *G09G 2360/16* (2013.01)

(58) Field of Classification Search
None
See application file for complete search history.

(56) References Cited

U.S. PATENT DOCUMENTS

| | | |
|---|---|---|
| 2,281,101 A | 4/1942 | Land |
| 3,961,839 A | 6/1976 | Brobst |

(Continued)

FOREIGN PATENT DOCUMENTS

| | | |
|---|---|---|
| EP | 0421809 A2 | 4/1991 |
| JP | H09274159 A | 10/1997 |
| JP | 2008032925 A | 2/2008 |

OTHER PUBLICATIONS

"How to Setup a Projector Screen", EBAY, Mar. 13, 2016. Retrieved from http://www.ebay.com/gds/How-to-Set-Up-a-Projector-Screen-/10000000205290613/g.html.

(Continued)

*Primary Examiner* — Gustavo D Polo (74) *Attorney, Agent, or Firm* — John L. Rogitz (57) ABSTRACT

Meta-material with individually-addressable elements is applied to a video projector screen to dynamically control light reflectance and grayscale. Example meta-material includes piezo electric elements, liquid crystal elements, and electrochromic elements. Methods of calibrating the screen with meta-material are disclosed. In one embodiment the screen is adjustable pixel by pixel. In another embodiment the screen is adjust by multi-pixel spans per line of meta-material. A camera may be used to provide feedback to the alignment system to make corrective adjustments to the screen.

19 Claims, 6 Drawing Sheets

(51) Int. Cl.
*G02F 1/15* (2006.01)
*G02B 26/08* (2006.01)

(56) References Cited

U.S. PATENT DOCUMENTS

| | | |
|---|---|---|
| 5,111,337 A | 5/1992 | Martinez |
| 5,218,472 A | 6/1993 | Jozefowicz et al. |
| 5,361,164 A | 11/1994 | Steliga |
| 5,625,489 A | 4/1997 | Glenn |
| 5,764,248 A | 6/1998 | Scarpetti |
| 5,777,720 A | 7/1998 | Shapiro et al. |
| 5,903,328 A | 5/1999 | Greene et al. |
| 6,013,123 A | 1/2000 | Scarpetti |
| 6,301,051 B1 | 10/2001 | Sankur |
| 6,530,664 B2 | 3/2003 | Vanderwerf et al. |
| 6,892,949 B2 | 5/2005 | Mondie |
| 7,072,108 B2 | 7/2006 | Cruz-Uribe et al. |
| 7,130,118 B2 | 10/2006 | Smythe et al. |
| 7,248,406 B2 | 7/2007 | May et al. |
| 7,384,158 B2 | 6/2008 | Ramachandran et al. |
| 7,480,096 B2 | 1/2009 | May et al. |
| 7,535,636 B2 | 5/2009 | Lippey et al. |
| 7,545,397 B2 | 6/2009 | O'Dea et al. |
| 7,614,750 B2 | 11/2009 | May et al. |
| 7,661,828 B2 | 2/2010 | Allen et al. |
| 7,733,310 B2 | 6/2010 | Hajjar et al. |
| 7,911,693 B2 | 3/2011 | Smith et al. |
| 7,936,507 B2 | 5/2011 | Sano et al. |
| 7,974,005 B2 | 7/2011 | Huibers et al. |
| 8,081,368 B2 | 12/2011 | Lippey |
| 8,218,236 B2 | 7/2012 | Shiau et al. |
| 8,284,487 B1 | 10/2012 | Liu |
| 8,411,983 B2 | 4/2013 | Wei |
| 8,469,519 B2 | 6/2013 | Marcus et al. |
| 8,649,090 B2 | 2/2014 | Hosoi |
| 8,913,000 B2 | 12/2014 | Erol et al. |
| 9,412,318 B2 | 8/2016 | Chang |
| 9,640,143 B1 | 5/2017 | Dawson et al. |
| 9,792,847 B2 | 10/2017 | Dawson et al. |
| 2003/0147053 A1 | 8/2003 | Matsuda et al. |
| 2004/0257649 A1 | 12/2004 | Heikkila et al. |
| 2005/0128581 A1 | 6/2005 | Samuels et al. |
| 2006/0061860 A1 | 3/2006 | Devos et al. |
| 2006/0209213 A1 | 9/2006 | Baker |
| 2006/0228523 A1 | 10/2006 | Cronin |
| 2006/0279839 A1 | 12/2006 | May et al. |
| 2007/0014318 A1 | 1/2007 | Hajjar et al. |
| 2007/0133088 A1 | 6/2007 | Lippey et al. |
| 2007/0177063 A1 | 8/2007 | Hiramatsu |
| 2008/0100564 A1 | 5/2008 | Vincent et al. |
| 2008/0144172 A1 | 6/2008 | Sano et al. |
| 2008/0239497 A1 | 10/2008 | Lippey |
| 2008/0304014 A1 | 12/2008 | Vaan |
| 2009/0086296 A1* | 4/2009 | Renaud-Goud .......... G03H 1/02 359/9 |
| 2010/0097699 A1 | 4/2010 | Destain et al. |
| 2010/0207956 A1 | 8/2010 | Keh et al. |
| 2011/0019914 A1 | 1/2011 | Bimber et al. |
| 2012/0223879 A1 | 9/2012 | Winter |
| 2013/0033530 A1 | 2/2013 | Gamache et al. |
| 2014/0028594 A1 | 1/2014 | Chen et al. |
| 2014/0104297 A1 | 4/2014 | Yang |
| 2014/0168288 A1 | 6/2014 | Tusch |
| 2014/0354698 A1 | 12/2014 | Lee et al. |
| 2015/0138627 A1 | 5/2015 | Ehrensperger et al. |
| 2015/0309316 A1 | 10/2015 | Osterhout et al. |
| 2016/0366379 A1 | 12/2016 | Hickl |
| 2017/0032728 A1 | 2/2017 | Shima et al. |
| 2017/0269360 A1 | 9/2017 | Yamaguchi et al. |

OTHER PUBLICATIONS

"Team Develops new, inexpensive transparent projection screen (w/Video)", Phys.Org, Jan. 21, 2014.

"Viewall® Erasable Wall Material", Visual Planning 2015 Corporation, Sep. 15, 2016. Retrieved from http://www.visualplanning.com/boardswallmaterial2.html.

Steven Richman, Thomas Dawson, Frederick J. Zustak, "Dual Layer EScreen to Compensate for Ambient Lighting", file history of related U.S. Appl. No. 15/601,758, filed May 22, 2017.

Thomas Dawson, Steven Richman, "Multichromic Filtering Layer to Enhance Screen Gain", file history of related U.S. Appl. No. 15/656,691, filed Jul. 21, 2017.

Thomas Dawson, Steven Richman, "Multichromic Reflective Layer to Enhance Screen Gain", file history of related U.S. Appl. No. 15/656,495, filed Jul. 21, 2017.

Thomas Dawson, Steven Richman, "Microfaceted Projection Screen", file history of related application U.S. Appl. No. 15/615,523, filed Jun. 6, 2017.

Steven Richman, Thomas Dawson, "Tile-Based Lenticular Projection Screen", file history of related application U.S. Appl. No. 15/666,247, filed Aug. 1, 2017.

Steven Richman, Thomas Dawson, "Wallpaper-Based Lenticular Projection Screen", file history of related U.S. Appl. No. 15/608,667, filed May 30, 2017.

Thomas Dawson, Steven Richman, Frederick J. Zustak, "Transparent Glass of Polymer Window Pane as a Projector Screen", file history of related U.S. Appl. No. 15/602,796, filed May 23, 2017.

Thomas Dawson, Steven Richman, "Multichromic Reflective Layer to Enhance Screen Gain", related U.S. Appl. No. 15/601,686, Non-Final Office Action dated May 15, 2018.

Thomas Dawson, Steven Richman, "Multichromic Reflective Layer to Enhance Screen Gain", related U.S. Appl. No. 15/656,495, Applicant's response to Non-Final Office Action filed May 21, 2018.

Thomas Dawson, Steven Richman, "Multichromic Reflective Layer to Enhance Screen Gain", related U.S. Appl. No. 15/656,495, Non-Final Office Action dated May 15, 2018.

Steven Martin Richman, Thomas Dawson, Frederick J. Zustak, "Dual Layer EScreen to Compensate for Ambient Lighting", related U.S. Appl. No. 15/601,758, Non-Final Office Action dated Jan. 19, 2018.

Steven Martin Richman, Thomas Dawson, Frederick J. Zustak, "Dual Layer EScreen to Compensate for Ambient Lighting", related U.S. Appl. No. 15/601,758, Applicant's response to Non-Final Office Action filed Jan. 23, 2018.

Thomas Dawson, Steven Richman, "Multichromic Reflective Layer to Enhance Screen Gain", related U.S. Appl. No. 15/656,495, Final Office Action dated Jan. 30, 2018.

Thomas Dawson, Steven Richman, "Multichromic Reflective Layer to Enhance Screen Gain", related U.S. Appl. No. 15/656,495, Applicant's response to Final Office Action filed Feb. 1, 2018.

Thomas Dawson, Steven Richman, "Multichromic Filtering Layer to Enhance Screen Gain", related U.S. Appl. No. 15/656,691, Final Office Action dated Jan. 30, 2018.

Thomas Dawson, Steven Richman, "Multichromic Filtering Layer to Enhance Screen Gain", related U.S. Appl. No. 15/656,691, Applicant's response to Final Office Action filed Feb. 1, 2018.

Thomas Dawson, Steven Richman, "Multichromic Reflective Layer to Enhance Screen Gain", related U.S. Appl. No. 15/856,495, Applicant's response to Final Office Action filed Aug. 8, 2018.

Thomas Dawson, Steven Richman, "Multichromic Filtering Layer to Enhance Screen Gain", related U.S. Appl. No. 15/658,691, Applicant's response to Final Office Action filed Aug. 8, 2018.

Thomas Dawson, Steven Richman, "Multichromic Reflective Layer to Enhance Screen Gain", related U.S. Appl. No. 15/656,495, Final Office Action dated Jul. 24, 2018.

Thomas Dawson, Steven Richman, "Multichromic Filtering Layer to Enhance Screen Gain", related U.S. Appl. No. 15/656,691, Final Office Action dated Jul. 26, 2018.

Thomas Dawson, Steven Richman, "Multichromic Filtering Layer to Enhance Screen Gain", related U.S. Appl. No. 15/656,691, Non-Final Office Action dated Jun. 12, 2018.

Thomas Dawson, Steven Richman, "Multichromic Filtering Layer to Enhance Screen Gain", related U.S. Appl. No. 15/656,691, Applicant's response to Non-Final Office Action filed Jun. 14, 2018.

(56) References Cited

OTHER PUBLICATIONS

Thomas Dawson, Steven Richman, "Microfaceted Projection Screen", related U.S. Appl. No. 15/615,523, Non-Final Office Action dated Sep. 27, 2018.
Thomas Dawson, Steven Richman, "Microfaceted Projection Screen", related U.S. Appl. No. 15/615,523, Applicant's response to Non-Final Office Action filed Oct. 1, 2018.
Thomas Dawson, Steven Richman, "Multichromic Reflective Layer to Enhance Screen Gain", related U.S. Appl. No. 15/656,495, Examiner's Answer dated Oct. 17, 2018.
Thomas Dawson, Steven Richman, "Multichromic Reflective Layer to Enhance Screen Gain", related U.S. Appl. No. 15/656,495, Reply Brief filed Oct. 24, 2018.

* cited by examiner

FIG. 1

Association of Pixels with Screen Pixels

FIG. 2

Alignment Initialization

FIG. 3

Calibration

TUNABLE LENTICULAR SCREEN TO CONTROL LUMINOSITY AND PIXEL-BASED CONTRAST

FIELD

The application relates generally to tunable lenticular screens to control luminosity and pixel-based contrast.

BACKGROUND

Television designers have gone to great lengths to control the backlight level even going so far as to provide per pixel backlight control for liquid crystal display (LCD) televisions. At the same time, the amount of light emitted by the television has increased dynamically. Coupling this large increase in both contrast and brightness with moving to ten bits per color component (over the eight bits previously used) creates what is termed "High Dynamic Range" content.

Because of the monochromatic nature of projection screens, it has been difficult to realize HDR content through a projector system. In allowed U.S. patent application Ser. No. 15/004,200, owned by the present assignee, an electronic eScreen capable of pixel level gray scale adjustment was disclosed that could be applied to a wall or other supporting substrate to provide a large surface for a video projector.

SUMMARY

In an aspect, a system includes a projection screen assembly that in turn includes a screen substrate and a layer of meta-material on the screen substrate. The layer of meta-material has an array of individually movable elements. A projector is provided for projecting video onto the projection screen assembly.

In some embodiments, the layer of meta-material includes piezoelectric elements. In addition or alternatively the layer of meta-material includes liquid crystals and/or electrochromic elements.

In non-limiting examples, the screen substrate includes a grid of actuatable elements for establishing grayscale values. The system may further include a controller configured with instructions to adjust configurations of individual ones of the individually movable elements to adjust reflection of light from the individually movable elements. The controller may be configured with instructions to control reflectance of light from the projector while simultaneously deflecting ambient light.

In another aspect, a method includes disposing a projector of color light relative to a projection screen assembly comprising individually movable elements arranged in an array. The method also includes using at least respective angles between the projector and plural of the individually movable elements to calibrate the respective individually movable elements to reflect light from the projector toward an expected viewing location.

In another aspect, an assembly includes a substrate and a layer of meta-material on the substrate that includes individually movable elements. A controller is programmed with instructions to configure the controller for moving subsets of the individually movable elements to reflect light from a projector toward a location.

The details of the present application, both as to its structure and operation, can best be understood in reference to the accompanying drawings, in which like reference numerals refer to like parts, and in which:

DETAILED DESCRIPTION

This disclosure relates generally to computer ecosystems including aspects of consumer electronics (CE) device networks such as projector systems. A system herein may include server and client components, connected over a network such that data may be exchanged between the client and server components. The client components may include one or more computing devices including video projectors and projector screens, portable televisions (e.g. smart TVs, Internet-enabled TVs), portable computers such as laptops and tablet computers, and other mobile devices including smart phones and additional examples discussed below. These client devices may operate with a variety of operating environments. For example, some of the client computers may employ, as examples, operating systems from Microsoft, or a Unix operating system, or operating systems produced by Apple Computer or Google. These operating environments may be used to execute one or more browsing programs, such as a browser made by Microsoft or Google or Mozilla or other browser program that can access web applications hosted by the Internet servers discussed below.

Servers and/or gateways may include one or more processors executing instructions that configure the servers to receive and transmit data over a network such as the Internet. Or, a client and server can be connected over a local intranet or a virtual private network. A server or controller may be instantiated by a game console such as a Sony Playstation (trademarked), a personal computer, etc.

Information may be exchanged over a network between the clients and servers. To this end and for security, servers and/or clients can include firewalls, load balancers, temporary storages, and proxies, and other network infrastructure for reliability and security. One or more servers may form an apparatus that implement methods of providing a secure community such as an online social website to network members.

As used herein, instructions refer to computer-implemented steps for processing information in the system. Instructions can be implemented in software, firmware or hardware and include any type of programmed step undertaken by components of the system.

A processor may be any conventional general purpose single- or multi-chip processor that can execute logic by means of various lines such as address lines, data lines, and control lines and registers and shift registers.

Software modules described by way of the flow charts and user interfaces herein can include various sub-routines, procedures, etc. Without limiting the disclosure, logic stated to be executed by a particular module can be redistributed to other software modules and/or combined together in a single module and/or made available in a shareable library.

Present principles described herein can be implemented as hardware, software, firmware, or combinations thereof; hence, illustrative components, blocks, modules, circuits, and steps are set forth in terms of their functionality.

Further to what has been alluded to above, logical blocks, modules, and circuits described below can be implemented or performed with one or more general purpose processors, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

The functions and methods described below, when implemented in software, can be written in an appropriate language such as but not limited to C# or C++, and can be stored on or transmitted through a computer-readable storage medium such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc. A connection may establish a computer-readable medium. Such connections can include, as examples, hard-wired cables including fiber optics and coaxial wires and digital subscriber line (DSL) and twisted pair wires. Such connections may include wireless communication connections including infrared and radio.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

Now specifically referring to FIG. 1, an example ecosystem 10 is shown, which may include one or more of the example devices mentioned above and described further below in accordance with present principles. The first of the example devices included in the system 10 is a projection screen assembly 12. The projection screen assembly 12 can be established by some or all of the components shown in FIG. 1. The projection screen assembly 12 includes an active display or screen in that it contains addressable screen elements that establish screen pixels and that can be controlled to establish grayscale values as demanded by a video file to be shortly disclosed.

For example, the projection screen assembly 12 can include one or more e-ink type screens or displays 14 that may be implemented by one or more e-ink arrays. An e-ink array may be made of small polyethylene spheres (for instance, between seventy five and one hundred micrometers in diameter). Each sphere may be made of negatively charged black plastic on one side and positively charged white plastic on the other. The spheres can be embedded in a transparent silicone sheet, with each sphere suspended in a bubble of oil so that it can rotate freely. The polarity of the voltage applied to each pair of electrodes then determines whether the white or black side is face-up, thus giving the pixel a white or black appearance. Other e-ink technology may use polyvinylidene fluoride (PVDF) as the material for spheres. Other e-ink technologies includes electrophoretic with titanium dioxide particles approximately one micrometer in diameter dispersed in a hydrocarbon oil, Microencapsulated Electrophoretic Displays, electrowetting, electrofluidic, and interferometric modulator displays that can create various colors using interference of reflected light, bistable displays such as flexible plastic electrophoretic displays, cholesteric liquid crystal displays, nemoptic displays made of nematic materials organic transistors embedded into flexible substrates, electrochromic displays, etc.

Other active screen technology that may be used include "meta materials", chemical-based active screens, and screens with pixels established by carbon nanotubes.

The projection screen assembly 12 may include one or more speakers 16 for outputting audio in accordance with present principles, and at least one input device 18 such as e.g. an audio receiver/microphone or key pad or control keys for e.g. entering commands to at least one screen processor 20. The example screen assembly 12 may also include one or more network interfaces 22 for communication over at least one network 24 such as the Internet, an WAN, an LAN, etc. under control of the one or more processors 20. Thus, the interface 22 may be, without limitation, a Wi-Fi transceiver, which is an example of a wireless computer network interface, such as but not limited to a mesh network transceiver, or it may be a Bluetooth or wireless telephony transceiver. It is to be understood that the processor 20 controls the screen assembly 12 to undertake present principles, including the other elements of the screen assembly 12 described herein such as e.g. controlling the display 14 to present images thereon and receiving input therefrom. Furthermore, note the network interface 22 may be, e.g., a wired or wireless modem or router, or other appropriate interface such as, e.g., a wireless telephony transceiver, or Wi-Fi transceiver as mentioned above, etc.

In addition to the foregoing, the screen assembly 12 may also include one or more input ports 26 such as, e.g., a high definition multimedia interface (HDMI) port or a USB port to physically connect (e.g. using a wired connection) to another CE device and/or a headphone port to connect headphones to the screen assembly 12 for presentation of audio from the screen assembly 12 to a user through the headphones. For example, the input port 26 (and/or network interface 22) may be connected via wire or wirelessly via the network 24 to a cable or satellite or other audio video source 28 with associated source processor 28A and source computer memory 28B. Thus, the source may be, e.g., a separate or integrated set top box, or a satellite receiver. Or, the source 28 may be a game console or personal computer or laptop computer or disk player. Yet again, the source 28 and/or the color video source discussed below may be cloud servers on the Internet, and may include and perform "cloud" functions such that the devices of the system 10 may access a "cloud" environment via the server 28 in example embodiments. Or, the server 28 may be implemented by a game console or other computer in the same room as the other devices shown in FIG. 1 or nearby.

In any case, the video source 28 controls the reflectance of the video shown on the screen assembly 12 by the below-described projector by inputting grayscale values to the active pixels of the screen assembly 12. The video source 28 may be a separate video source as shown which receives full color video and derives a grayscale rendering thereof according to principles discussed below, in which case the source 28 is tailored to source a separate piece of grayscale content to maximize the usage of the reflectance properties of the screen assembly 12. Such a source 28 may be separate from the screen assembly 12 as shown or it may be incorporated into the screen assembly 12 in some implementations.

Or the source 28 may be the same as the color video source mentioned below, in which case the color video source may include a color video file for projection onto the screen assembly 12 and a corresponding grayscale video file that is sent to the screen assembly 12 to control the active elements in the screen assembly 12.

The screen assembly 12 may further include one or more computer memories 30 such as disk-based or solid state storage that are not transitory signals, in some cases embodied in the chassis of the screen as standalone devices or as a personal video recording device (PVR) or video disk player either internal or external to the chassis of the AVDD for playing back AV programs or as removable memory media.

Figure 1:
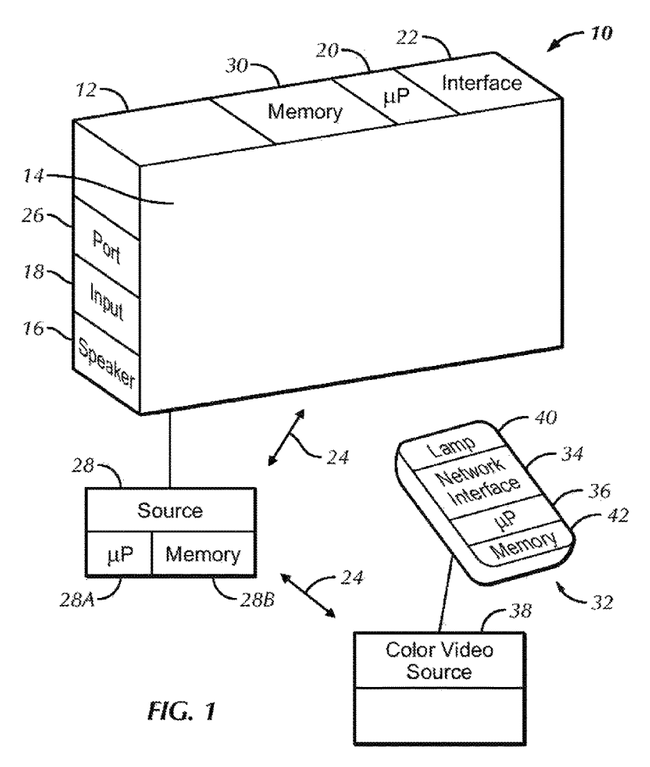
FIG. 1 is a block diagram of an example system including an example in accordance with present principles.

Still referring to FIG. 1, in addition to the AVDD 12, the system 10 may include one or more other device types. When the system 10 is a home network, communication between components may be according to the digital living network alliance (DLNA) protocol. Or, the projector and screen can be used in a public movie theater.

In one example, a front projector 32 such as but not limited to a Sony ultra short throw (UST) projector may be used to project demanded images onto the front of the display 14. The example projector 32 may include one or more network interfaces 34 for communication over the network 24 under control of one or more projector processors 36. Thus, the interface 34 may be, without limitation, a Wi-Fi transceiver, which is an example of a wireless computer network interface, including mesh network interfaces, or a Bluetooth transceiver, or a wireless telephony transceiver.

It is to be understood that the projector processor 36 controls the projector 32 to undertake present principles. In this regard, the projector processor 36 may receive signals representing demanded color images from a color video source 38 which may be the same as or different from the video source 28 described previously and which may be established by any one or more of the source types described previously. When separate grayscale and color sources are used, as opposed to separate grayscale and color video files on the same source, the sources 28, 38 may communicate with each other, e.g., via a wired communication path or via the network 24 as shown.

The projector processor 36 controls a lamp assembly 40 to project color light onto the screen assembly 12. The lamp assembly may be a laser lamp assembly or other type of color illuminator assembly. The projector may further include one or more computer memories 42 such as disk-based or solid state storage.

As shown in FIG. 1, the screen 12 may be mounted on a substrate 44 such as but not limited to a wall or window.

Figure 2:
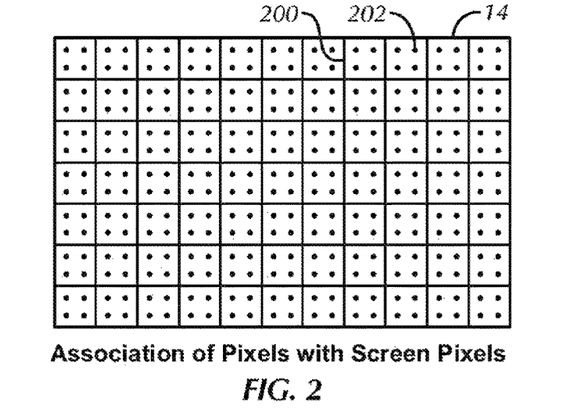
FIG. 2 is a schematic view of the projection screen showing larger projected pixels superimposed on groups of smaller screen pixels to illustrate that each projected pixel is associated with a respective group of screen pixels.

FIG. 2 illustrates that each of at least some and more typically all of the full color projection pixels 200 that are projected onto the screen 14 by the projector 32 may be superimposed on a respective group of multiple smaller screen pixels 202. In the embodiment of FIG. 2, the screen pixels 202 are the active addressable elements of the active screen, e.g., e-ink globes. Thus, the projected pixels 200 that establish the color video images are larger than the active pixels 202 within the screen 14. In the example shown, four screen pixels 202 are correlated to a single projected pixel 200, although different numbers of screen pixels 202 may be correlated to the projected pixels 200. Note that depending on screen curvature and other factors as discussed below, while each projected pixel 200 typically overlaps multiple screen pixels 202, the number of screen pixels 202 assigned to a first projected pixel 200 may not be the same as the number of screen pixels 202 assigned to a second projected pixel 200.

In the example shown, the projected pixels 202 are illustrated as rectilinear areas that border each other across the entirety of the screen 14. In implementation the shape of each projected pixel 202 may not be precisely rectilinear owing to bleed over of light caused by reflection and other effects including lens structure on the projector 32, but present principles understand that such bleed over between adjacent projected pixels 200 is minimized owing to the grayscale control afforded by control of the screen pixels 202 described below. Also, in implementation the footprint of the combined projected pixels 200 that establish the color video image may not be exactly coterminous with, and may be smaller than, the entire active area of the screen 14, in which case FIG. 2 illustrates only the region of the active portion of the screen 14 onto which the color image is projected.

Figure 3:
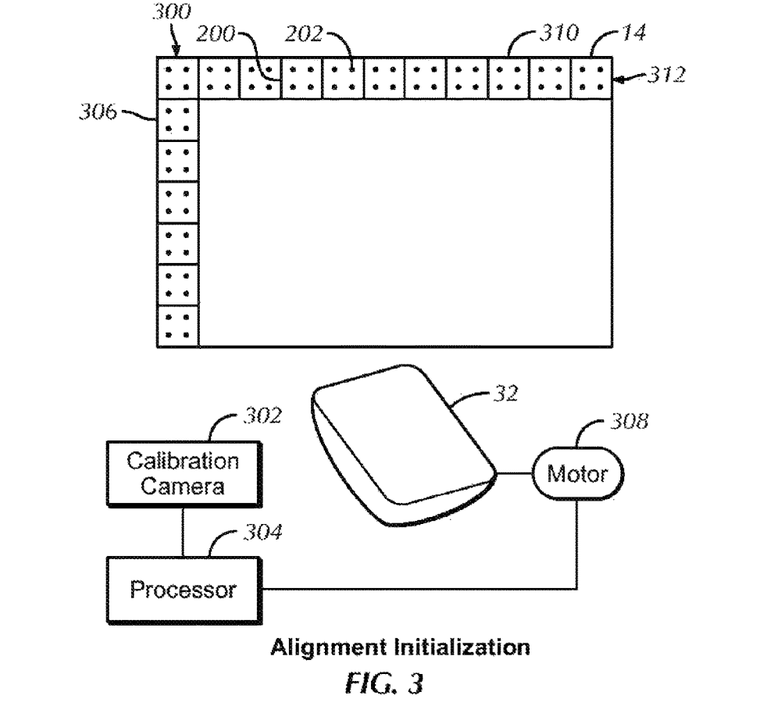
FIG. 3 is a schematic view of the projection screen illustrating an example alignment initialization process, in which one or more edges of the projected pixel footprint are aligned with respective edges of the screen.

FIG. 3 illustrates an example alignment initialization process of a calibration process for assigning groups of screen pixels to individual projected pixels. In some implementations, the edges of the projected image from the projector 32 are first aligned with edges of the active area of the screen 14. In the example shown, a left-most column 300 of projected pixels 200 can be projected onto the screen 14. A calibration camera 302 may capture the image of the column 300. The calibration camera 302 can be controlled by a processor 304.

Based on the image from the calibration camera 302, the optics of the projector 32 and/or the direction in which the projector 32 is pointed and/or the distance at which the projector 32 is from the screen 14 can be modified to align the left-most column 300 with the left edge 306 of the active portion of the screen 14 as shown, with the left edge being made more visibly manifest by causing the left-most one, two, or three columns of screen pixels 202 to be all white. The projector 32 may be moved left or right by hand by a person observing the image of the column 300 and/or the column 300 itself as it appears on the screen. Or, the processor 304 may receive the image of the column 300 and control a motor 308 (such as a servo or stepper motor or other appropriate apparatus) to move the optics and/or housing of the projector 32 to align the column 300 with the left edge 306.

Note that in some implementations, the left most column 300 may not be aligned with the left edge 306 of the active portion of the screen but rather with a column of screen pixels 202 that is inboard of the left edge and thereafter regarded as a virtual left edge by the system.

It may also be desirable to align the projector 32 with the top edge 310 of the screen 14, with the top edge being made more visibly manifest if desired by causing the top-most one, two, or three rows of screen pixels 202 to be all white. In the example shown, a top-most row 312 of projected pixels 200 can be projected onto the screen 14. The calibration camera 302 may capture the image of the row 312.

Based on the image from the calibration camera 302, the optics of the projector 32 and/or the direction in which the projector 32 is pointed and/or the distance at which the projector 32 is from the screen 14 can be modified to align the top-most row 312 with the top edge 310 of the active portion of the screen 14 as shown. The projector 32 may be moved hand by a person observing the image of the row 312 and/or looking at the row 312 itself as it appears on the screen. Or, the processor 304 may receive the image of the row 312 and control the motor 308 to move the optics and/or housing of the projector 32 to align the row 312 with the top edge 310.

Note that in some implementations, the top most column 312 may not be aligned with the top edge 310 of the active portion of the screen but rather with a column of screen pixels 202 that is below the top edge and thereafter regarded as a virtual top edge by the system. Note further that the edges 306, 310 may alternatively be the physical edges of the screen if desired, when the physical edges are not coterminous with the edges of the active portion of the screen.

If desired, once the left and top rows of projected are aligned with the left and top edges as described, the right and bottom projected pixel column/row may be aligned with the respective edges of the screen according to the algorithm above by, e.g., expanding or shrinking the footprint of the projected image using, e.g., the optics of the projector or by other means. Or, once the first two edges are aligned, the remaining two edges of the projected image may be projected onto the screen with the underlying screen pixels thus being designated as the virtual right and bottom edge of the screen for calibration purposes.

Present principles recognize that rows and columns of screen pixels 202 may not be precisely linear. For example, the screen 14 may be deliberately configured to be mildly concave, and/or local artifacts might exist to introduce non-linearity. Accordingly, FIG. 4 illustrates that once the projector 32 is aligned with the physical or virtual edges of the screen 14, groups of screen pixels 202 may be associated with respective projected pixels 200 so that when color video is projected onto the screen by means of the projected pixels 200, the grayscale of the respective screen area onto which each projected pixel is directed is established by the screen pixels associated with that projected pixel according to disclosure below, even in the presence of non-linearities.

Figure 4:
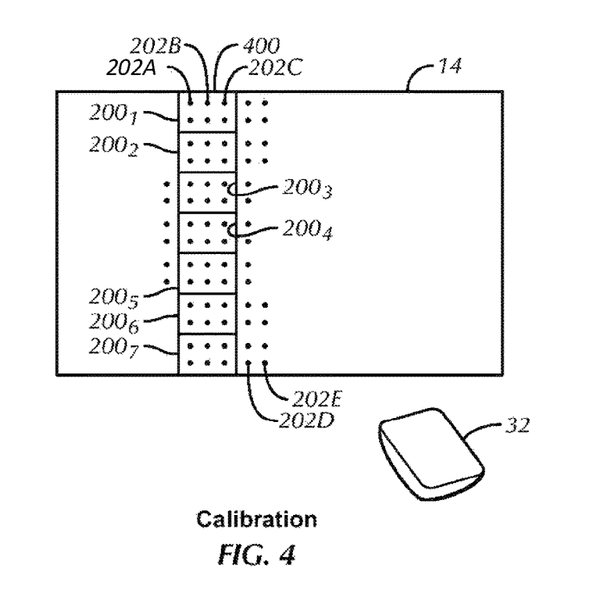
FIG. 4 is a schematic view of the projection screen illustrating an example alignment process, in which a mapping of the association of the screen pixels to projected pixels is generated.

For illustration purposes, FIG. 4 assumes that each projected pixel 200 encompasses an on-screen area in which three columns and two rows of screen pixels 202 are present. Thus, each of at least some, and in most cases all, of the projected pixels 200 is associated with plural (e.g., six) screen pixels 202. As shown, a column of projected pixels 200 may be projected onto the screen 14. It is to be understood that the process of FIG. 4 can start with the left-most column, working right. Rows may also be aligned according to the algorithm described herein, top to bottom. Or, a grid of projected pixels may be projected onto the screen, combining column alignment and row alignment in a consolidated process.

For simplicity of disclosure, a single column 400 of projected pixels $200_1$-$200_7$ is shown and screen assignment discussed for the pixels in that column. FIG. 4 shows five columns 202A, 202B, 202C, 202D, 202E of screen pixels with the three left-most columns 202A-C initially being assigned to the column 400 of projected pixels. Candidate columns of screen pixels may be "illuminated" for calibration purposes by, e.g., causing the pixels in the candidate columns all to assume the white configuration.

FIG. 4 illustrates that the columns 202A-E are not linear, with the left-most column 202A moving out of the projected column 400 and the fourth column 200D moving into the projected column 400 beginning at the third projected pixel $200_3$. The screen pixel columns shift back right by one pixel beginning at the sixth projected pixel $200_6$. The alignment set up in FIG. 4 may be imaged by the calibration cameras shown in FIG. 3, for example, with the calibration image being sent to one or more of the above-described processors for image analysis to note the above-described non-linearity of the screen pixel columns.

In the example shown, the first, second, sixth, and seventh projected pixels $200_1$, $200_2$, $200_6$, $200_7$ would be associated with screen pixels in the respective row of the respective projected pixel from the first through third columns 202A, 202B, 202C of screen pixels based on, e.g., imaging the presence of those screen pixels within the respective projected pixels, with screen pixels in other candidate columns not being associated with these respective projected pixels. In contrast, the third, fourth, and fifth projected pixels $200_3$, $200_4$, $200_5$ would be associated with screen pixels in the respective row of the respective projected pixel from the second through fourth columns 202B, 202C, 202D of screen pixels. The process may continue using successive columns and then rows (or using a grid as mentioned above) of projected pixels to associate respective groups of screen pixels 202 with each respective one of at least some and preferably all projected pixels 200 while accounting for possible non-linearities in the screen 14.

Figure 5:
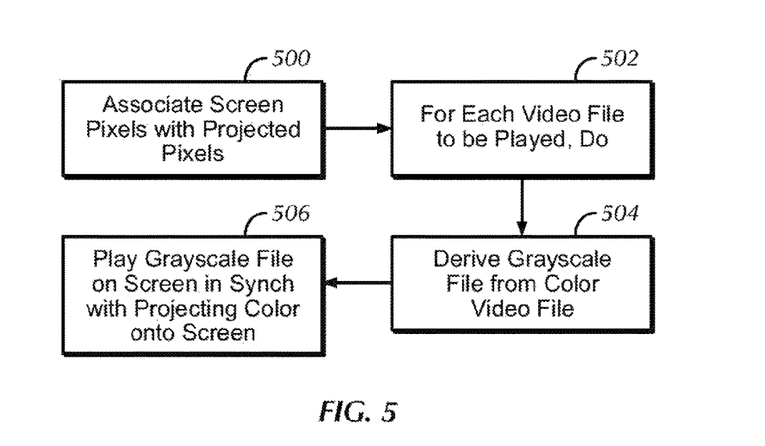
FIG. 5 is a flow chart of example logic.

Now referring to FIG. 5, the overall logic of example implementations may be seen. At block 500 screen pixel groups are associated with each individual projected pixel according to the algorithms described above. Thus, each one of some or all of the color pixels in a color video file to be projected is associated with a respective plurality of screen pixels.

The grayscale value to be established by the screen pixels associated with a particular color pixel to be projected are then derived as follow. At block 502, for a color video file to be projected onto the screen 14, the logic moves to block 504 to derive a grayscale file from the color video file. The grayscale file may be derived on a pixel-by-pixel basis.

Any appropriate method may be used for deriving a grayscale file from a color file such that the grayscale values in the grayscale file are synchronized with the color values in the color file using, e.g., timing information carried over from the color file into the grayscale file.

As examples, a grayscale value can be derived as follows for each color pixel to be projected.

In systems in which luminance is directly indicated in the pixel data, that luminance may be used as the grayscale value.

When the pixel data indicates only color values for red, green, and blue (RGB), the corresponding grayscale value to be inserted into the grayscale file can use weighted sums calculated from the RGB values, if desired after the gamma compression function has been removed first via gamma expansion.

In some embodiments, gamma expansion may be defined as:

$$C_{\mathrm{linear}}=\begin{cases}\frac{C_{\mathrm{srgb}}}{12.92}, & C_{\mathrm{srgb}}\le 0.04045 \\ \left(\frac{C_{\mathrm{srgb}}+0.055}{1.055}\right)^{2.4}, & C_{\mathrm{srgb}}>0.04045\end{cases}$$

where Csrgb represents any of the three gamma-compressed sRGB primaries (Rsrgb, Gsrgb, and Bsrgb, each in range [0,1]) and Clinear is the corresponding linear-intensity value (R, G, and B, also in range [0,1]).

Then, luminance can be calculated as a weighted sum of the three linear-intensity values. The sRGB color space is defined in terms of the CIE 1931 linear luminance Y, which is given by $$Y=0.2126R+0.7152G+0.0722B. \quad [5]$$

The coefficients represent the measured intensity perception of typical trichromat humans, depending on the primaries being used; in particular, human vision is most sensitive to green and least sensitive to blue. To encode grayscale intensity in linear RGB, each of the three primaries can be set to equal the calculated linear luminance Y (replacing R,G,B by Y,Y,Y to get this linear grayscale). Linear luminance typically needs to be gamma compressed to get back to a conventional non-linear representation.

In contrast, for images in color spaces such as Y'UV and its relatives, which are used in standard color TV and video systems such as PAL, SECAM, and NTSC, a nonlinear luma component (Y') can be calculated directly from gamma-compressed primary intensities as a weighted sum, which can be calculated quickly without the gamma expansion and compression used in colorimetric grayscale calculations. In the Y'UV and Y'IQ models used by PAL and NTSC, the grayscale component can be computed as $$Y'=0.299R'+0.587G'+0.114B'$$

where the prime distinguishes these gamma-compressed values from the linear R, G, B, and Y discussed above.

Yet again, for the ITU-R BT.709 standard used for HDTV developed by the ATSC, the grayscale value "Y'" can be calculated as:

$$Y'=0.2126R'+0.7152G'+0.0722B'.$$

Although these are numerically the same coefficients used in sRGB above, the effect is different because they are being applied directly to gamma-compressed values.

Recall that each color pixel to be projected is associated with plural screen pixels. Accordingly, once a single grayscale value is established for each color pixel to be projected, the process then uses that grayscale value to establish screen pixel control data defining the configuration of each of the plural screen pixels associated with the respective color pixel to be projected. Thus, each grayscale value may be expanded into "N" screen pixel control values to establish, for each screen pixel in the group of "N" screen pixels associated with the color pixel to be projected from whence the grayscale value was derived, whether that screen pixel is to be controlled to be white or black.

In one embodiment, this is done using stippling or stippling-like techniques, in which for lighter grayscale values, more of the screen pixels are caused to present a white appearance, and for darker grayscale values, more of the screen pixels are caused to present a black appearance, sometimes using randomly-selected pixels from among the group of screen pixels.

As additional illustrative examples of stippling-like techniques, halftoning or dithering may be used to configure the plural screen pixels associated with the respective color pixel to be projected to establish the derived grayscale value. Example non-limiting details of such techniques may be found in, e.g., Martin et al., "Scale-Dependent and Example-Based Stippling", *Computers & Graphics*, 35(1):160-174 (2011) and Salomon, "The Computer Graphics Manual" (Springer-Verlag London, Ltd., 2011), both of which are incorporated herein by reference.

Note that the grayscale file may contain either one or both of the grayscale values corresponding to a single color pixel to be projected, and the In cases in which the refresh rate of the color video is faster than the refresh rate afforded by the active screen, each grayscale value may be an average of multiple color video values for the associated color pixel to be projected during a single cycle of screen refresh to which the grayscale value applies. For example, if the screen is refreshed 30 times per second and the color video is refreshed 60 times per second, each grayscale value may be the average of the two grayscale values derived from the two color pixels to be projected during the single screen refresh period. Or, each grayscale value may be a selected one of the multiple color video values for the associated color pixel to be projected during a single cycle of screen refresh to which the grayscale value applies.

While a 4K screen is mentioned above, it is to be understood that other screen resolutions are encompassed by present principles. For example, individual pixels can be increased on the screen for 8K or higher projection systems or combined to a visually equivalent e-ink contrast grid that allows for larger grayscale areas or blocks. This could happen, for instance, when a 4K projection is presented on a very large screen. The combination of the screen size and the projection resolution influences the size of the matching grayscale contrast areas or blocks of e-ink on the screen. Moreover, the e-ink areas can be adjusted for pixel aspect ratios of different sizes, such as square versus rectangular. The e-ink pixel area shape and size can be tailored to how the color video to be projected is shot, e.g., either as DV or intended for film.

Figure 6:
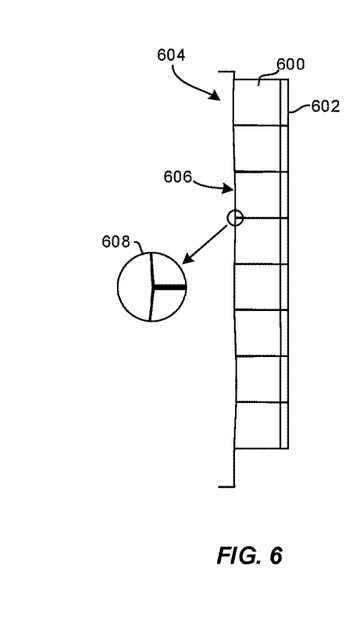
FIG. 6 is schematic side view of lenticular elements on an uneven mounting surface.

FIG. 6 shows that meta-material that may be configured in a sheet 600 having individually movable elements 602 can be applied on or in a projection substrate 604. The substrate 604 may be any one of the eScreens described above or it may be a conventional non-active substrate such as a wall or non-active screen onto which images are to be projected.

In any case, as indicated by the non-linear vertical surface 606 of the substrate 604 and as shown in the magnified portion at 608, the substrate 604 may not be perfectly flat due to the surface it is mounted on and/or sue to mechanical tension caused by the mounting method, or for other reasons. The individual meta-material elements 602, as more fully described below, can be actuated to flex or to otherwise move to compensate for the substrate 604 not being perfectly flat, to render an improved projected image.

Figure 7:
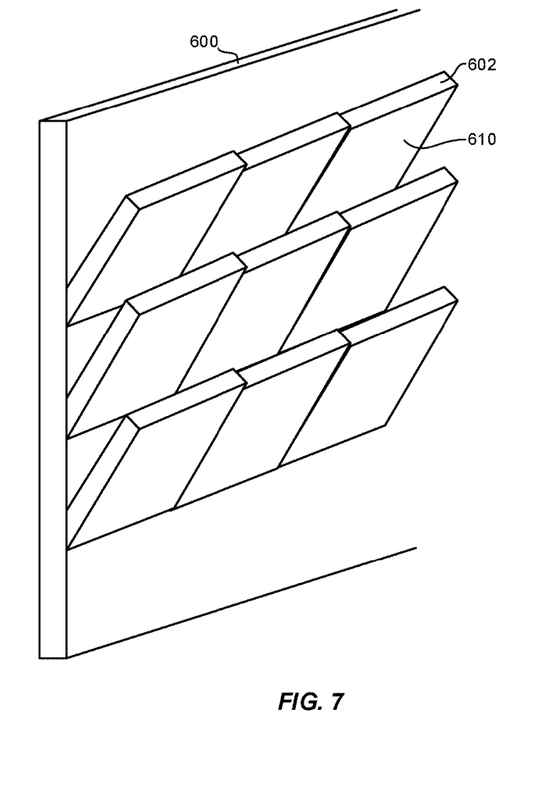
FIG. 7 is schematic perspective view of the lenticular elements.

As shown in FIG. 7, in example embodiments the elements 602 may be arranged in multiple rows and columns in a grid or array, and each element (or groups of elements) may be movable relative to the sheet 600 (which may be integrated into or part of the substrate 604), with the outer surface 610 of each element being reflective.

Figure 8:
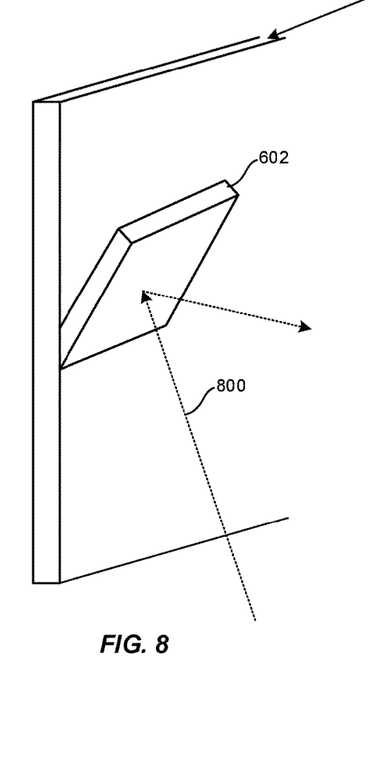
FIGS. 8-10 are schematic perspective views of a single element in various configurations.
Figure 9:
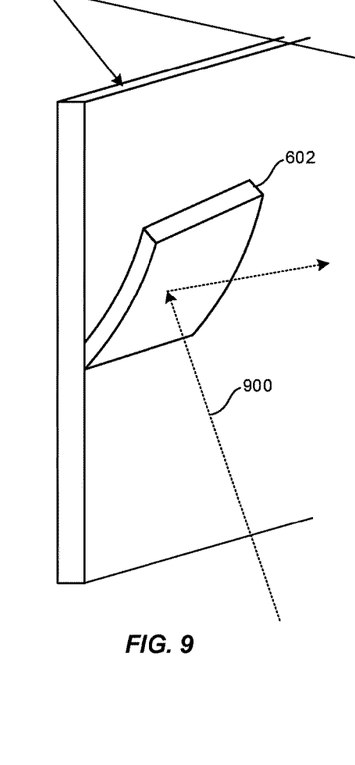
Figure 10:
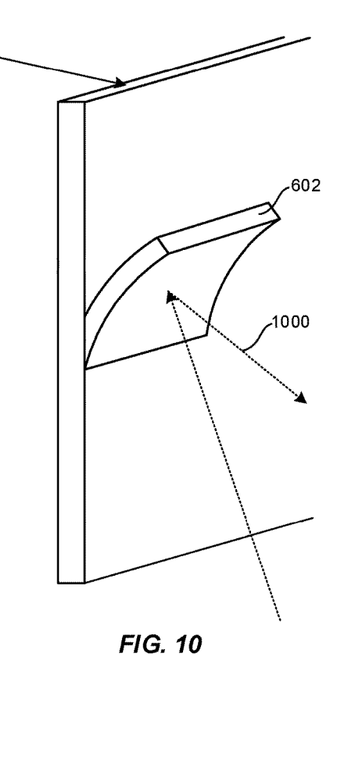

As shown in cross-reference to FIGS. 8-10, an element 602 may assume flat planar form and may be moved to be at an oblique angle with respect to the sheet 600/mounting substrate 604 to alter the path of reflected light, as indicated by the rays 800, to correct for a mounting surface that is not perfectly flat at the location of the surface over which the element 602 is disposed.

Or, as shown in FIG. 9 an element 602 may assume a convex configuration and may also extend obliquely from the mounting surface to alter the path of reflected light, as indicated by the rays 900. Yet again, FIG. 10 shows that an element 602 may assume a concave configuration and may also extend obliquely from the mounting surface to alter the path of reflected light, as indicated by the rays 1000. Applying voltage to an individual element can, depending on the specific type of meta-material, change its shape (from planar to convex or concave and back again) and/or the angle at which it is oriented relative to the mounting surface.

Examples of meta-material include piezoelectric elements, liquid crystals, and electrochromic elements.

Thus, the meta-material is applied on or within a video projector's screen and dynamically controlled for light reflectance and grayscale establishment. By precisely adjusting the screen's ability to reflect light, image luminosity can be controlled. A standard (non-active) projection screen can be enhanced to deliver higher dynamic range images such that the screen's brightness is tuned at the level of an individual pixel or subpixel area.

Figure 11:
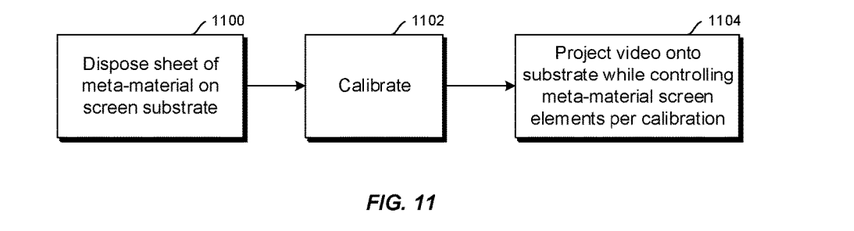
FIG. 11 is a flow chart of example projection logic consistent with present principles.

FIG. 11 illustrates example high-level logic. Commencing at block 1100, the meta-material is disposed on the projector surface substrate. This may be done, for example, by adhering the sheet 600 to the substrate 604, or by other appropriate methods. The meta-material is calibrated at block 1102, and then at block 1104 video is projected onto the meta-material with the elements 602 being controlled to reflect projected light according to the calibration at block 1102 while rejecting ambient light by, e.g., directing ambient light coming from other than the direction of the projector away from an expected viewing location of the screen.

Figure 12:
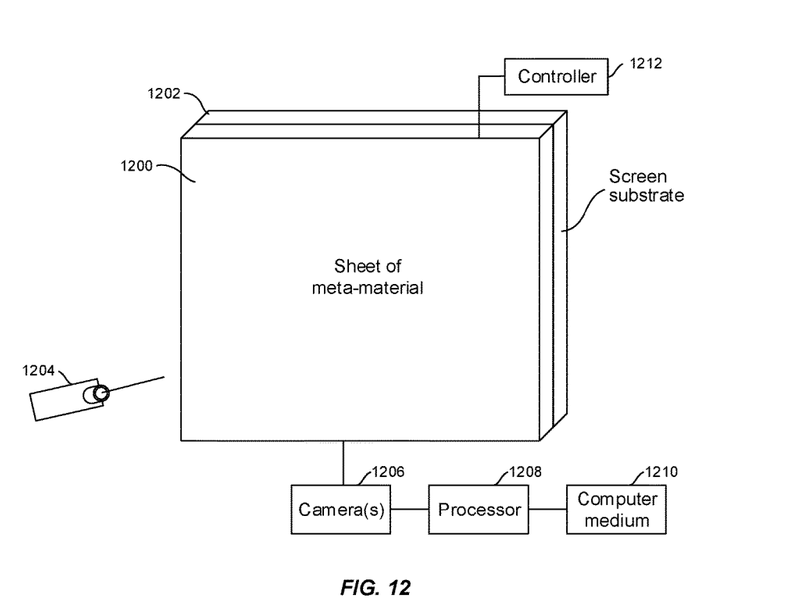
FIG. 12 is a schematic diagram of a calibration/operation assembly.

FIG. 12 illustrates methods of calibrating the screen. In FIG. 12 the sheet of meta-material is designated 1200 and the projector substrate surface is designated 1202. A projector 1204 such as any of the above-described projectors is disposed at a known distance and location (including orientation and elevation) with respect to the sheet 1200. The meta-material sheet 1200 securely placed onto the substrate 1202 for precise light guide adjustments on the projector 1204, with spatially filtered laser beams. The projector's angle of light beam incidence is algorithmically calibrated for each element of the meta-material. A camera 1026 may be disposed at an expected viewing location of the screen, and light emitted by the projector 1204 onto an individual element of the meta-material, with the camera 1206 detecting (or not) a corresponding reflection of the projected light. If no reflection is detected, the configuration and/or angle of the particular meta-material element under test is adjusted until a reflection of projected light is detected by the camera. This adjustment may be done under control of a processor 1208 accessing instructions on a computer 1210 and receiving images from the camera 1206.

Preferably, the configuration and/or angle of the particular meta-material element under test also is adjusted to maintain reflected projector light at the expected viewing location while also reflecting ambient light from locations distanced from the projector 1204 away from the expected viewing location. The combination of controlling the screen's reflectance of the projector light, while simultaneously deflecting ambient light, and increasing or decreasing the pixel level grayscale significantly improves screen contrast ratios. The projector's dynamically adjusted light profile makes it possible to deliver high-precision laser beams on a pixel and subpixel basis that allow for the shaping and tuning of an image on the screen. Precise levels of micrometer screen detail are calibrated for light reflectance for each pixel, such that the screen only reflects the projector's intended pixel based light intensity. In one embodiment the screen is adjustable pixel by pixel. In another embodiment the screen is adjust by multi-pixel spans per line of meta-material.

The above methods may be implemented as software instructions executed by a processor, including suitably configured application specific integrated circuits (ASIC) or field programmable gate array (FPGA) modules, or any other convenient manner as would be appreciated by those skilled in those art. Where employed, the software instructions may be embodied in a device such as a CD Rom or Flash drive or any of the above non-limiting examples of computer memories that are not transitory signals. The software code instructions may alternatively be embodied in a transitory arrangement such as a radio or optical signal, or via a download over the internet.

It will be appreciated that whilst present principals have been described with reference to some example embodiments, these are not intended to be limiting, and that various alternative arrangements may be used to implement the subject matter claimed herein.

What is claimed is:

1. A system comprising:
a projection screen assembly comprising:
a layer of meta-material comprising an array of individually movable elements; and
a projector for projecting video onto the projection screen assembly, wherein the layer of meta-material is juxtaposed with a screen substrate comprising a grid of actuatable elements for establishing grayscale values.

2. The system of claim 1, wherein the layer of meta-material comprises piezoelectric elements.

3. The system of claim 1, wherein the layer of meta-material comprises liquid crystals.

4. The system of claim 1, wherein the layer of meta-material comprises electrochromic elements.

5. The system of claim 1, comprising a controller configured with instructions to adjust configurations of individual ones of the individually movable elements to adjust reflection of light from the individually movable elements.

6. The system of claim 5, wherein the controller is configured with instructions to control reflectance of light from the projector while simultaneously deflecting ambient light.

7. A method comprising:
disposing a projector of color light relative to a projection screen assembly comprising individually movable elements arranged in an array;
using at least respective angles between the projector and plural of the individually movable elements to calibrate the respective individually movable elements to reflect light from the projector toward an expected viewing location; and
moving at least some of the individually movable elements to redirect ambient light away from the expected viewing location.

8. The method of claim 7, comprising calibrating individual ones of the individually movable elements.

9. The method of claim 7, comprising calibrating, as one, plural of the individually movable elements arranged in a line.

10. The method of claim 7, comprising using a camera to provide feedback during calibration.

11. The method of claim 7, wherein at least some of the individually movable elements comprise piezoelectric elements.

12. The method of claim 7, wherein at least some of the individually movable elements comprise liquid crystals.

13. An assembly, comprising:
a substrate;
a layer of meta-material on the substrate, the layer of meta-material comprising individually movable elements; and
a controller programmed with instructions to configure the controller for moving subsets of the individually movable elements to reflect light from a projector toward a location, wherein the individually movable elements comprise electrochromic elements, or piezoelectric elements, or a combination of electrochromic elements and piezoelectric elements.

14. The assembly of claim 13, wherein the location is an expected viewing location of video projected onto the meta-material.

15. The assembly of claim 13, wherein at least one subset consists of a single individually movable element.

16. The assembly of claim 13, wherein at least one subset comprises plural individually movable elements and not all of the individually movable elements.

17. The assembly of claim 13, comprising the projector for projecting video onto the meta-material.

18. The assembly of claim 13, wherein the individually movable elements comprise piezoelectric elements.

19. The assembly of claim 13, wherein the individually movable elements comprise electrochromic elements.

* * * * *